(12) United States Patent
Waga et al.

(10) Patent No.: US 11,359,986 B2
(45) Date of Patent: Jun. 14, 2022

(54) ELECTRONIC DEVICE HAVING FIXED CONDUCTIVE PLATES AND ELASTIC CONDUCTIVE PLATES

(71) Applicant: Alps Alpine Co., Ltd., Tokyo (JP)

(72) Inventors: Satoshi Waga, Miyagi-ken (JP); Keisuke Nakayama, Miyagi-ken (JP); Junichi Hosogoe, Miyagi-ken (JP); Shinji Kikuchi, Miyagi-ken (JP); Kazuhiko Suzuki, Tokyo (JP)

(73) Assignee: ALPS ALPINE CO., LTD., Tokyo (JP)

( * ) Notice: Subject to any disclaimer, the term of this patent is extended or adjusted under 35 U.S.C. 154(b) by 478 days.

(21) Appl. No.: 16/552,771

(22) Filed: Aug. 27, 2019

(65) Prior Publication Data

US 2019/0383689 A1 Dec. 19, 2019

Related U.S. Application Data

(63) Continuation of application No. PCT/JP2018/007081, filed on Feb. 27, 2018.

(30) Foreign Application Priority Data

Mar. 14, 2017 (JP) .............................. JP2017-048149

(51) Int. Cl.
*G01P 15/08* (2006.01)
*G01L 19/14* (2006.01)
*G01D 11/24* (2006.01)
*H01R 13/15* (2006.01)
*H01R 13/66* (2006.01)

(52) U.S. Cl.
CPC ............ *G01L 19/14* (2013.01); *G01D 11/245* (2013.01); *G01P 15/08* (2013.01); *H01R 13/15* (2013.01); *H01R 13/6683* (2013.01)

(58) Field of Classification Search
CPC ....... G01L 19/14; G01D 11/245; G01P 15/08; H01R 13/15
See application file for complete search history.

(56) References Cited

U.S. PATENT DOCUMENTS 6,204,749 B1 3/2001 Ishihara
6,637,260 B2 10/2003 Hosogoe
(Continued)

FOREIGN PATENT DOCUMENTS

| JP | 10-32107 | 2/1998 |
| JP | 2001-4365 | 1/2001 |
| WO | WO 2011/158801 | 12/2011 |

OTHER PUBLICATIONS

International Search Report for corresponding International Application No. PCT/JP2018/007081, dated May 22, 2018, 4 pages.

*Primary Examiner* — Jamel E Williams
(74) *Attorney, Agent, or Firm* — Crowell & Moring LLP

(57) ABSTRACT

Fixed conductive plates are buried in a case. In its internal space, a first contact surface, which is part of each fixed conductive plate, and a second contact surface, which is an inner surface of the case, are opposite to each other, and an elastic conductive plate is interposed in this opposing portion. The elastic conductive plate is structured so that, in a restricting portion, a support piece portion is fitted to the thin plate portion of the fixed conductive plate and that an elastic arm portion extends from the support piece portion.

5 Claims, 6 Drawing Sheets

(56) References Cited

U.S. PATENT DOCUMENTS

| | | | |
|---|---|---|---|
| 2003/0167858 A1 | 9/2003 | Terui et al. | |
| 2006/0005923 A1* | 1/2006 | Ikeda | H03H 3/08 156/292 |
| 2017/0223855 A1* | 8/2017 | Suzuki | H05K 7/12 |
| 2019/0386411 A1* | 12/2019 | Kikuchi | H01R 13/428 |

* cited by examiner

ELECTRONIC DEVICE HAVING FIXED CONDUCTIVE PLATES AND ELASTIC CONDUCTIVE PLATES

CLAIM OF PRIORITY

This application is a Continuation of International Application No. PCT/JP2018/007081 filed on Feb. 27, 2018, which claims benefit of Japanese Patent Application No. 2017-048149 filed on Mar. 14, 2017. The entire contents of each application noted above are hereby incorporated by reference.

BACKGROUND

1. Field of the Disclosure

The present disclosure relates to an electronic device that includes, in a case fixed conductive plates and elastic conductive plates pressed elastically against fixed electrode portions provided on a circuit board or the like on which a physical quantity sensor is mounted.

2. Description of the Related Art

An arrangement related to an electronic part in which external terminals (fixed conductive plates) and internal terminals (elastic conductive plates) are provided in a cabinet 1 is described in Japanese Unexamined Patent Application Publication No. 10-32107.

This electronic part includes external terminals 2 fixed in the cabinet 1. Each external terminal 2 is bent to form a flat portion 2a and an opposing portion 2f so that they face each other. An internal terminal 3, which can be elastically deformed, is attached between the flat portion 2a and opposing portion 2f of the external terminal 2.

A flat portion 3a, a first elastic portion 3b bent from the flat portion 3a, and an abutting portion 3c at the top of the first elastic portion 3b are formed integrally with the internal terminal 3. The flat portion 3a is elastically in contact with the flat portion 2a of the external terminal 2, and the abutting portion 3c is elastically in contact with the opposing portion 2f of the external terminal 2. A 180-degree turn-back portion is provided at the top of the flat portion 3a of the internal terminal 3. A second elastic portion 3d extends from the turn-back portion. A contact point 3e at the top of the second elastic portion 3d is elastically in contact with a resistive pattern 4a on the front surface of an insulated substrate 4.

The internal terminal 3 integrally has a stopper portion 3f, which is formed by cutting part of the flat portion 3a and raising the cut portion. This stopper portion 3f is engaged with a concave portion 2b formed in the external terminal 2 or with a concave portion 1t formed in a side wall of the cabinet 1 to prevent the internal terminal 3 from coming off.

In the electronic part described in Japanese Unexamined Patent Application Publication No. 10-32107, the stopper portion 3f, which is cut from the flat portion 3a of the internal terminal 3 and is raised, is engaged with the concave portion 2b or concave portion 1t to prevent the internal terminal 3 from coming off. However, this engagement between the stopper portion 3f and the concave portion alone is insufficient to adequately prevent the internal terminal 3 from coming off. To more efficiently prevent the internal terminal 3 from coming off, it is necessary to make the stopper portion 3f long. This causes a problem in that the internal terminal 3 becomes larger than necessary.

Another problem with the electronic part described in Japanese Unexamined Patent Application Publication No. 10-32107 is that the top of the flat portion 3a of the internal terminal 3 is turned back 180 degrees as illustrated in FIGS. 3 and 4 in the publication. By providing this 180-degree turn-back portion, the position of the base end of the internal terminal 3 extending from the turn-back portion is determined. In this structure, however, when a force is exerted on the second elastic portion 3d, stress concentrates on the 180-degree turn-back portion. This is likely to become a cause of fatigue.

SUMMARY

In an electronic device in which a fixed conductive plate, part of which becomes an external terminal portion, an elastic conductive plate connected to the fixed conductive plate, and a fixed electrode portion that is electrically continuous to the elastic conductive plate are provided in a case, an electronic has a fixed conductive plate and an elastic conductive plate.

In the electronic device: a first contact surface and a second contact surface, which are opposite to each other, are provided in the case. At least one of the first contact surface and the second contact surface comprise the front plate surface of the fixed conductive plate. The elastic conductive plate is integrally formed from a metal leaf spring material, a first pressure contact portion, which is elastically pressed against the first contact surface, a second pressure contact portion, which is turned-backed from the first pressure contact portion and is elastically pressed against the second contact surface, a support piece portion, which is bent from the second pressure contact portion and extends beyond the first contact surface, an elastic arm portion, which is bent from the support piece portion and extends toward the fixed electrode portion, and an elastically-pressed contact point, which is provided at the top of the elastic arm portion so as to be elastically pressed against the fixed electrode portion. At least one of the first pressure contact portion and the second pressure contact portion is in contact with the front plate surface of the fixed conductive plate. A linkage end is part of the fixed conductive plat. The linkage end and the support piece portion of the elastic conductive plate are fitted to each other to form a restricting portion that restricts the support piece from separating from the fixed electrode portion.

Since, in the electronic device, the support piece portion is restricted and fixed in the restricting portion, the base end (support end) of the elastic arm portion, which is a cantilever beam, can be set in a place that substantially matches the bending boundary portion between the support piece portion and the elastic arm portion. Since the base end (support end) of the elastic arm portion can be determined, the working lengths of elastic arm portions can be easily made uniform and an optimum pressure contact force can be set between an elastically-pressed contact portion and the fixed electrode portion. In addition, since a 180-degree turn-back portion or the like is not necessary, concentration of stress on the base end (support end) of the elastic arm portion can be mitigated and accumulation of fatigue can thereby be reduced.

DESCRIPTION OF THE EXEMPLARY EMBODIMENTS

Figure 1:
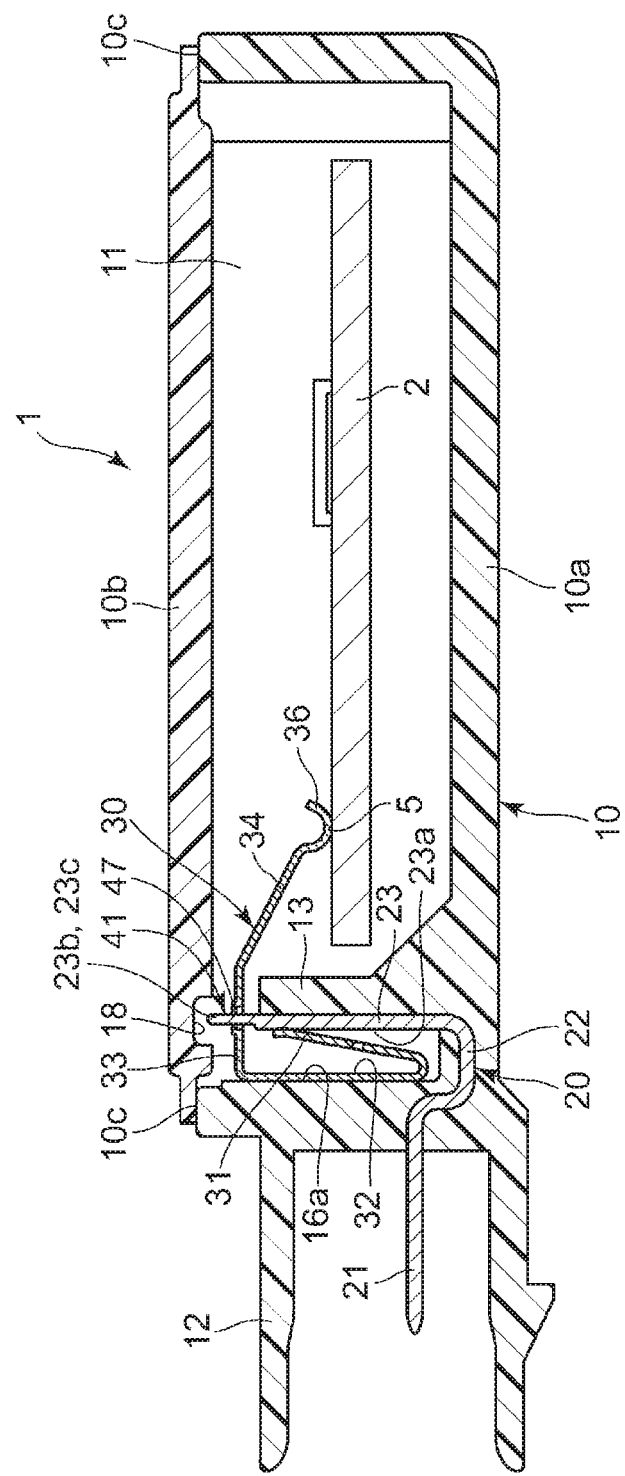
FIG. 1 is a cross-sectional view illustrating an electronic device in a first embodiment of the present invention.
Figure 2:
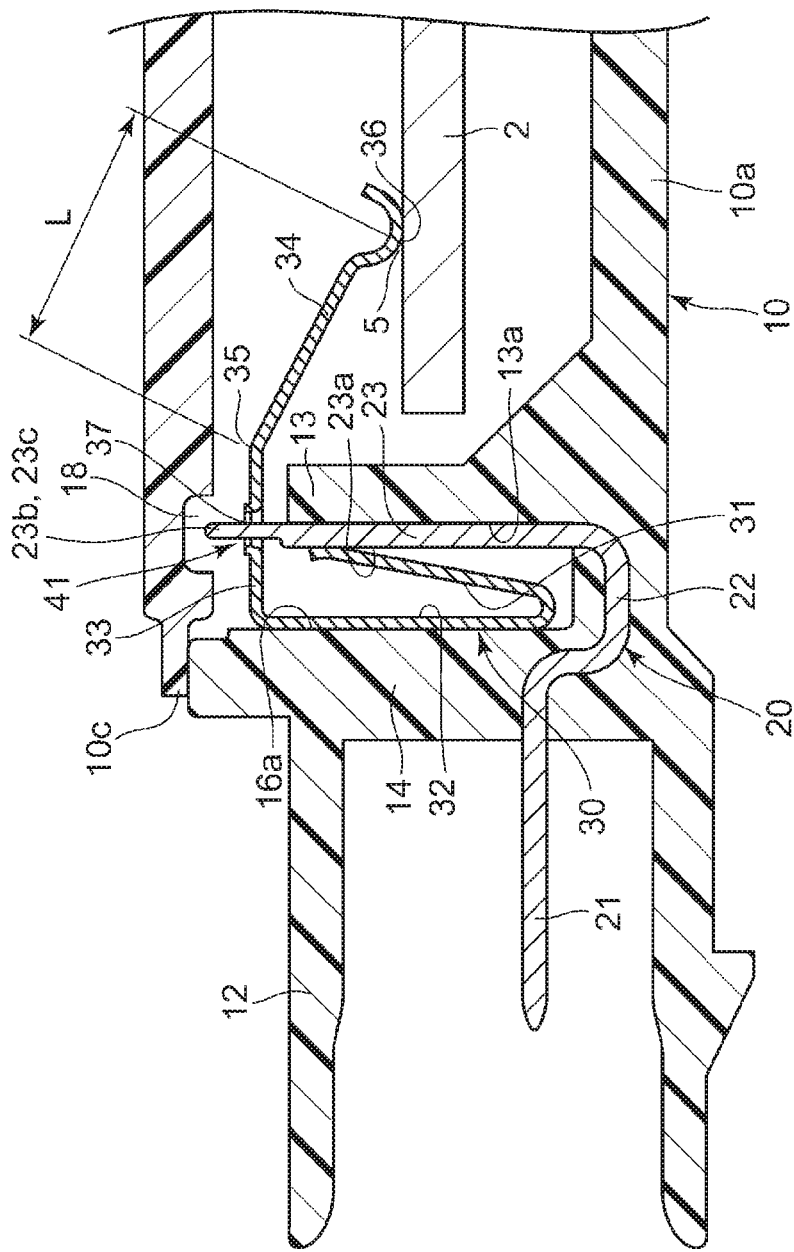
FIG. 2 is a partially enlarged view of the cross-section of the electronic device in the first embodiment illustrated in FIG. 1.
Figure 3:
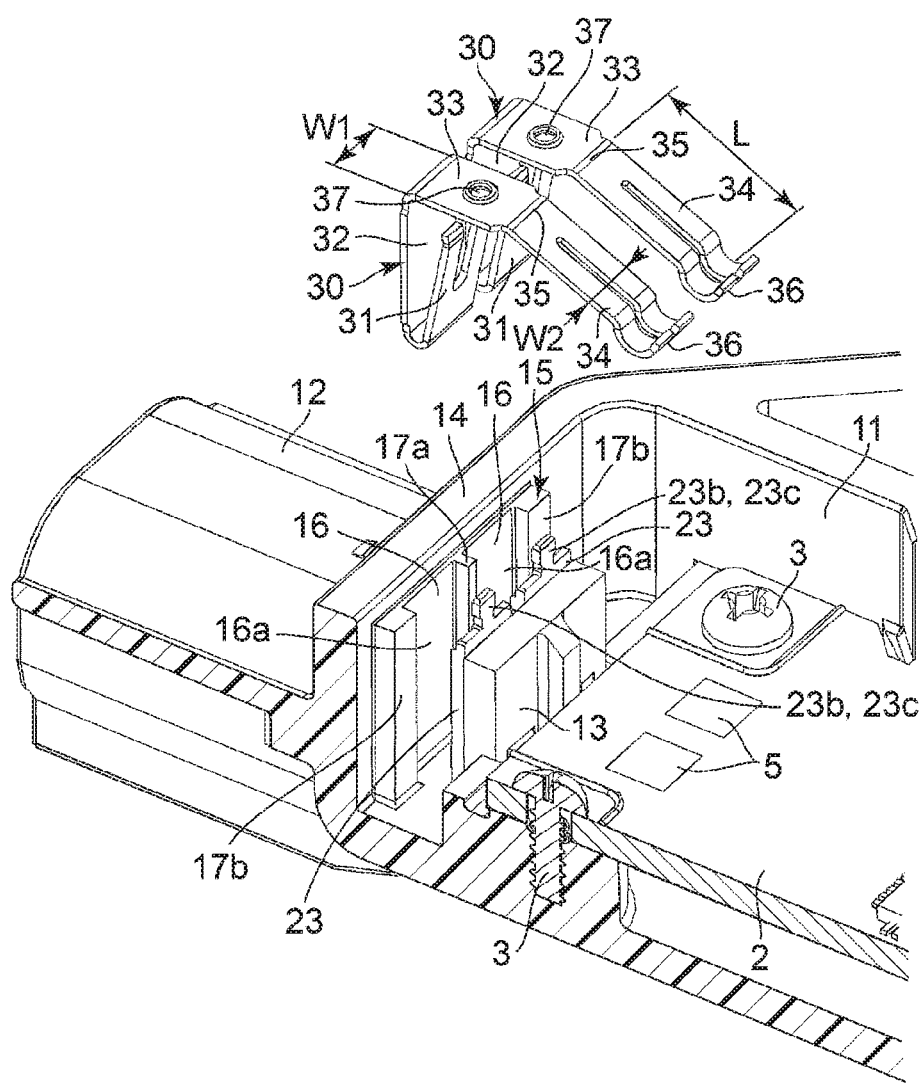
FIG. 3 is an exploded perspective view illustrating the structure of the electronic device in the first embodiment illustrated in FIG. 1, the drawing including a partial sectional-view.

FIGS. 1 and 2 are each a cross-sectional view of an electronic device 1 in a first embodiment of the present invention. FIG. 3 is an exploded perspective view of the electronic device 1, the drawing including a partial cross-section.

In this electronic device 1, a circuit board 2 is accommodated in internal space 11 in a case (cabinet) 10. As illustrated in FIG. 3, the circuit board 2 is fixed to the case 10 with fixing screws 3. On the circuit board 2, an acceleration sensor is mounted as a physical quantity sensor.

The physical quantity sensor is not limited to an acceleration sensor; the physical quantity sensor may be a pressure sensor, a humidity sensor, an angular velocity sensor, or the like. The electronic device 1 is for use in a vehicle. The electronic device 1 is attached to, for example, the axle or its support portion to detect acceleration exerted on the vehicle body. Therefore, the electronic device 1 is needed to be structured so that even if large acceleration is exerted on the electronic device 1, a contact failure or the like is not caused in the internal structure.

The case 10 is made of a synthetic resin. The case 10 is structured by combining a first case 10a forming the internal space 11 and a second case 10b, in a cover body structure, that covers the opening portion of the internal space 11. The edge 10c of the second case 10b is bonded and fixed to the opening end of the first case 10a. Alternatively, the edge 10c is fixed by screwing or laser welding.

As indicated in FIGS. 1 to 3, a connector portion 12 in a hollow shape is formed integrally with the first case 10a on its left side in the drawing. Fixed conductive plates 20 are buried in the first case 10a. The first case 10a is injection-molded from a synthetic resin. During this molding, the fixed conductive plates 20 are inserted into a mold and the first case 10a and fixed conductive plates 20 are integrated together by so-called insert-molding. However, the fixed conductive plates 20 may be fixed in another method; for example, after the first case 10a has been molded, the fixed conductive plates 20 may be inserted into the already-molded first case 10a.

The fixed conductive plate 20 is comprised of a conductive metal plate made of brass or the like. The fixed conductive plate 20 has an external terminal portion 21. The external terminal portion 21 protrudes from the first case 10a into the interior of the connector portion 12. Portions, of the fixed conductive plate 20, that are buried in the first case 10a are the base of the external terminal portion 21 and a bent bottom 22, which is bent from the base in the downward direction in the drawings.

Figure 4:
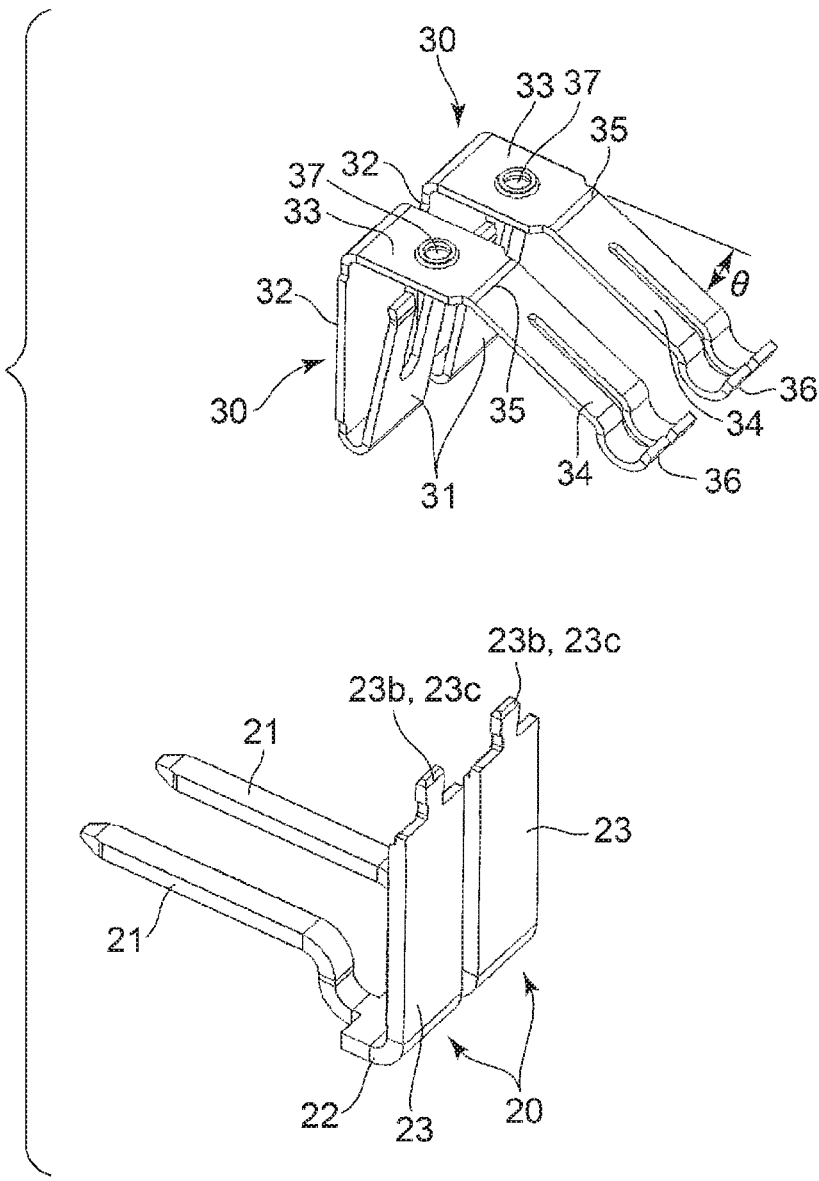
FIG. 4 is an exploded perspective view illustrating fixed conductive plates and elastic conductive plates provided in the electronic device in the first embodiment illustrated in FIG. 1.

As indicated in FIGS. 1 to 3, an inner wall portion 13 erected from the bottom side in the drawings toward the internal space 11 is formed integrally with the first case 10a. As indicated in FIGS. 3 and 4, the fixed conductive plate 20 includes a contact plate portion 23 bent from the bent bottom 22 substantially at right angles. The contact plate portion 23 is supported in a state in which the contact plate portion 23 is in tight contact with an opposing inner surface 13a of the inner wall portion 13.

As illustrated in FIG. 3, the first case 10a has a peripheral wall portion 14 continuous to the connector portion 12. A peripheral wall support portion 15 opposite to the inner wall portion 13 is formed integrally with an inner wall, facing the internal space 11, of the peripheral wall portion 14. A pair of holding concave portions 16 extending in the up-and-down direction is formed in the peripheral wall support portion 15. A partitioning rib 17a extending in the up-and-down direction is integrally formed between the two holding concave portions 16. Partitioning ribs 17b extending in the up-and-down direction are integrally formed at the ends of the holding concave portions 16, one partitioning rib 17b at each end.

As illustrated in FIGS. 1 and 2, a plate surface of the fixed conductive plate 20, the plate surface being the front surface of the contact plate portion 23, is a first contact surface 23a, and the front surface of the holding concave portion 16 is a second contact surface 16a. In the internal space 11 of the case 10, the first contact surface 23a and second contact surface 16a are opposite to each other in parallel. In this embodiment, the first contact surface 23a is the front plate surface of the contact plate portion 23 of the fixed conductive plate 20, and the second contact surface 16a is the front surface of a synthetic resin material from which the case 10 is formed. Contrary to this embodiment, however, the first contact surface 23a may be the front surface of the inner wall portion 13, and the second contact surface 16a may be the front plate surface of the fixed conductive plate 20 positioned in the holding concave portion 16. Alternatively, both the first contact surface 23a and second contact surface 16a may be the front plate surface of the fixed conductive plate 20.

In the internal space 11 of the case 10, an opposing portion between the first contact surface 23a and the second contact surface 16a is space in which the elastic conductive plate 30 is accommodated. The elastic conductive plate 30 is formed from a leaf spring metal material such as a stainless steel material or beryllium copper material. As illustrated in FIGS. 3 and 4, the elastic conductive plate 30 is bent in a V-shape, forming a first pressure contact portions 31 and a second pressure contact portions 32. The elastic conductive plate 30 is inserted into the case 10 while the bent portion between the first pressure contact portion 31 and the second pressure contact portion 32 faces downward. Thus, a pair of elastic conductive plates 30 is attached in the accommodation space. When each of the pair of elastic conductive plates 30 is attached in the accommodation space in the first case 10a, the first pressure contact portion 31 is elastically pressed against the first contact surface 23a and the second pressure contact portion 32 is elastically pressed against the second contact surface 16a. Since the first contact surface 23a is the front plate surface of the fixed conductive plate 20, the fixed conductive plate 20 and elastic conductive plate 30 are electrically continuous to each other on the first contact surface 23a.

The fixed conductive plate 20 and elastic conductive plate 30 each have a gold-plated layer formed at least on the front surface of a conductive contact portion. The gold-plated layer is formed on the front surface of a substrate layer formed from nickel or the like.

As illustrated in FIGS. 3 and 4, each elastic conductive plate 30 integrally has a support piece portion 33, which is bent from the top of the second pressure contact portion 32 substantially at right angles. As illustrated in FIGS. 1 and 2, the support piece portion 33 passes besides the first contact surface 23a, passes through an opposing portion between and the second case 10b and the contact plate portion 23 having the first contact surface 23a, and extends toward the interior of the internal space 11. The elastic arm portion 34 integrally extends from the support piece portion 33. The elastic arm portion 34 is bent downward from the boundary portion 35 between the support piece portion 33 and the elastic arm portion 34, and the top of the elastic arm portion 34 is the elastically-pressed contact point 36, which is deformed in a concavely curved surface shape. The elastic arm portion 34 extends toward the fixed electrode portion 5 provided on the front surface of the circuit board 2 illustrated in FIG. 3, and the elastically-pressed contact point 36 is elastically pressed against the fixed electrode portion 5.

As illustrated in FIG. 3, the width dimension W2 of the elastic arm portion 34 is smaller than the width dimension W1 of the support piece portion 33. The width dimension changes in steps at the boundary portion 35. At the boundary portion 35 of the elastic conductive plate 30, therefore, the stiffness of the elastic arm portion 34 is lower than the stiffness of the support piece portion 33 in steps. The working length L of the elastic arm portion 34, which functions as a cantilever beam, is a length from the boundary portion 35, which is the bending portion, to the contact point between the elastically-pressed contact point 36 and the fixed electrode portion 5.

As illustrated in FIGS. 1 to 4, a thin plate portion 23b is formed at the top of the contact plate portion 23 of the fixed conductive plate 20. The thin plate portion 23b may have a reduced thickness dimension by being deformed by pressure molding. This thin plate portion 23b is a linkage end 23c. A hole 37 may be formed in the support piece portion 33 of the elastic conductive plate 30 by a so-called burring process. The thin plate portion 23b (linkage end 23c) at the top of the contact plate portion 23 may be fitted to the hole 37 to form a restricting portion 41. The restricting portion 41 prevents the support piece portion 33 of the elastic conductive plate 30 from being deformed in a direction away from the fixed electrode portion 5 (a direction away from the circuit board 2) and also prevents the support piece portion 33 from moving.

As illustrated in FIG. 2, a concave portion 18 may be formed in the lower surface of the second case 10b. The top of the thin plate portion 23b may be inserted into the concave portion 18. Even if the fitting between the thin plate portion 23b and the hole 37 is loosened due to the exertion of unexpected acceleration or the like, the support piece portion 33 that begins to be deformed in the upward direction in the drawing abuts the lower surface of the second case 10b without the thin plate portion 23b coming off the hole 37. Therefore, even if the support piece portion 33 is raised in the upward direction in the drawing, plastic deformation can be prevented.

The electronic device 1 in the first embodiment is mounted on the axle of a vehicle, its support portion, or the like. The acceleration of the vehicle body is detected by an acceleration sensor mounted on the circuit board 2. Alternatively, other various types of information may be detected by other physical quantity sensors. Detection signals of the acceleration sensor and the like undergo information processing by an integrated circuit (IC) chip or the like mounted on the circuit board 2. The elastically-pressed contact points 36 of a pair of elastic conductive plates 30 are each elastically pressed against the fixed electrode portion 5, and the signal that has undergone information processing is transmitted from a conductive pattern on the circuit board 2 through the fixed electrode portion 5 to the elastic conductive plate 30. Furthermore, the first pressure contact portion 31 of the elastic conductive plate 30 is in contact with the contact plate portion 23 of the fixed conductive plate 20, the signal that has undergone information processing is given from the pair of elastic conductive plates 30 to a pair of fixed conductive plates 20. A plug is fitted into the connector portion 12 of the case 10.

With the fixed conductive plate 20 and elastic conductive plate 30, in the restricting portion 41, the thin plate portion 23b (the linkage end 23c) at the top of the contact plate portion 23 is fitted into the hole 37 formed in the support piece portion 33 as illustrated in FIGS. 1 and 2. The dimensions of the thin plate portion 23b are set so that it can be forcibly press-fitted into the hole 37. With a fitting force due to the press-fitting, the fixed conductive plate 20 is held so that it does not easily move in the upward direction in the drawings from the fitting state illustrated in FIG. 2.

As illustrated in FIG. 3, the width dimension W1 of the support piece portion 33 of the elastic conductive plate 30 is larger than the width dimension W2 of the elastic arm portion 34, so a step with the width dimension W2 is provided at the boundary portion 35 between the support piece portion 33 and the elastic arm portion 34. In addition, the support piece portion 33 is strongly held in the restricting portion 41 so that the support piece portion 33 is not separated from the fixed electrode portion 5 in the upward direction in the drawing. Therefore, the elastic deformation of the support piece portion 33 is suppressed and the elastic arm portion 34 functions as a cantilever beam having the length L from the boundary portion 35 to the elastically-pressed contact point 36 as an essential working length.

With the elastic conductive plate 30, a bending angle between the second pressure contact portion 32 and the support piece portion 33 is approximately 90 degrees. As illustrated in FIG. 4, an angle θ by which the support piece portion 33 is bent from the support piece portion 33 is 90 degrees or less and is 45 degrees or less. Furthermore, a 180-degree turn-back portion as described in Japanese Unexamined Patent Application Publication No. 10-32107 is not provided. With the elastic conductive plate 30, the working length L of the elastic arm portion 34 can be determined, making it easy to appropriately set an elastic force with which the elastically-pressed contact point 36 at the top of the elastic arm portion 34 is elastically pressed against the fixed electrode portion 5. Since the elastic conductive plate 30 does not have a large turn-back portion, it becomes possible to prevent large stress from concentrating on the base end (support end, that is, boundary portion 35) of the elastic arm portion 34.

Figure 5:
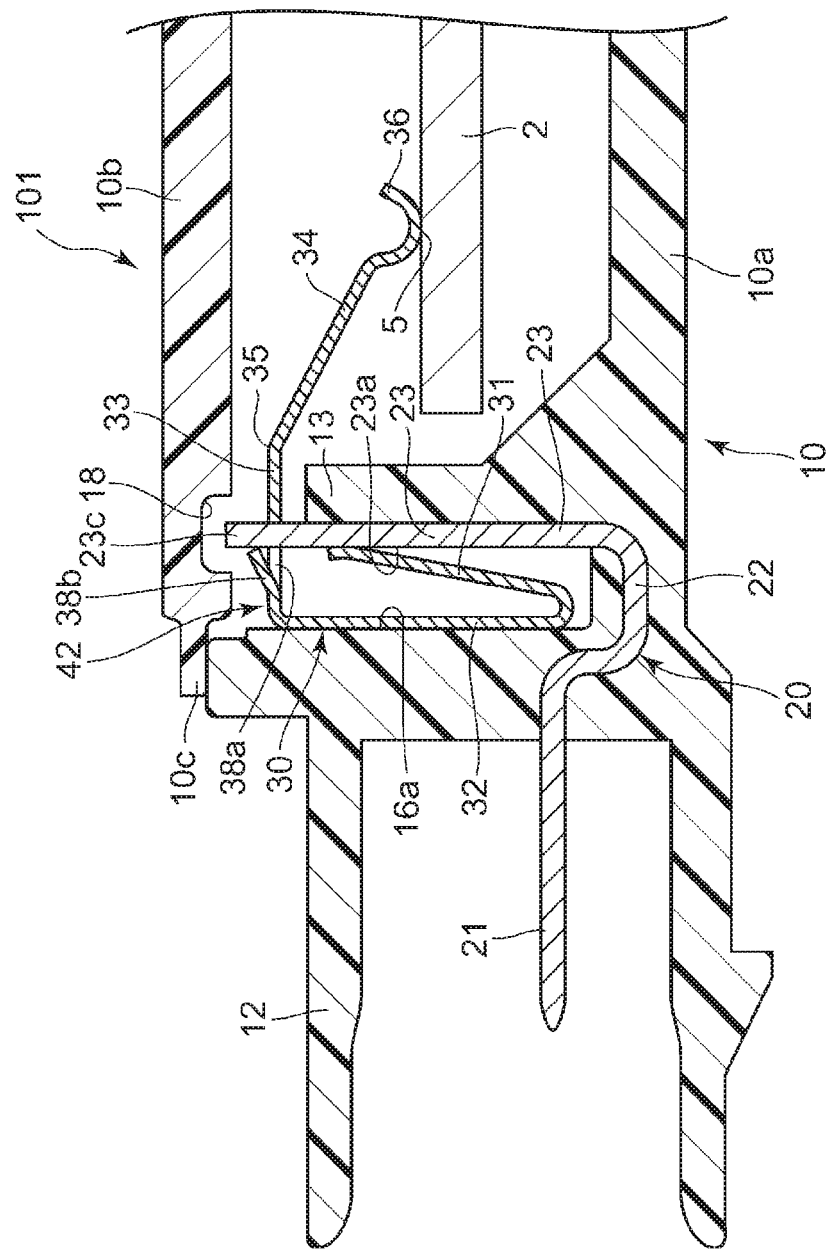
FIG. 5 is a partially enlarged view of a cross-sectional view of an electronic device in a second embodiment.
Figure 6:
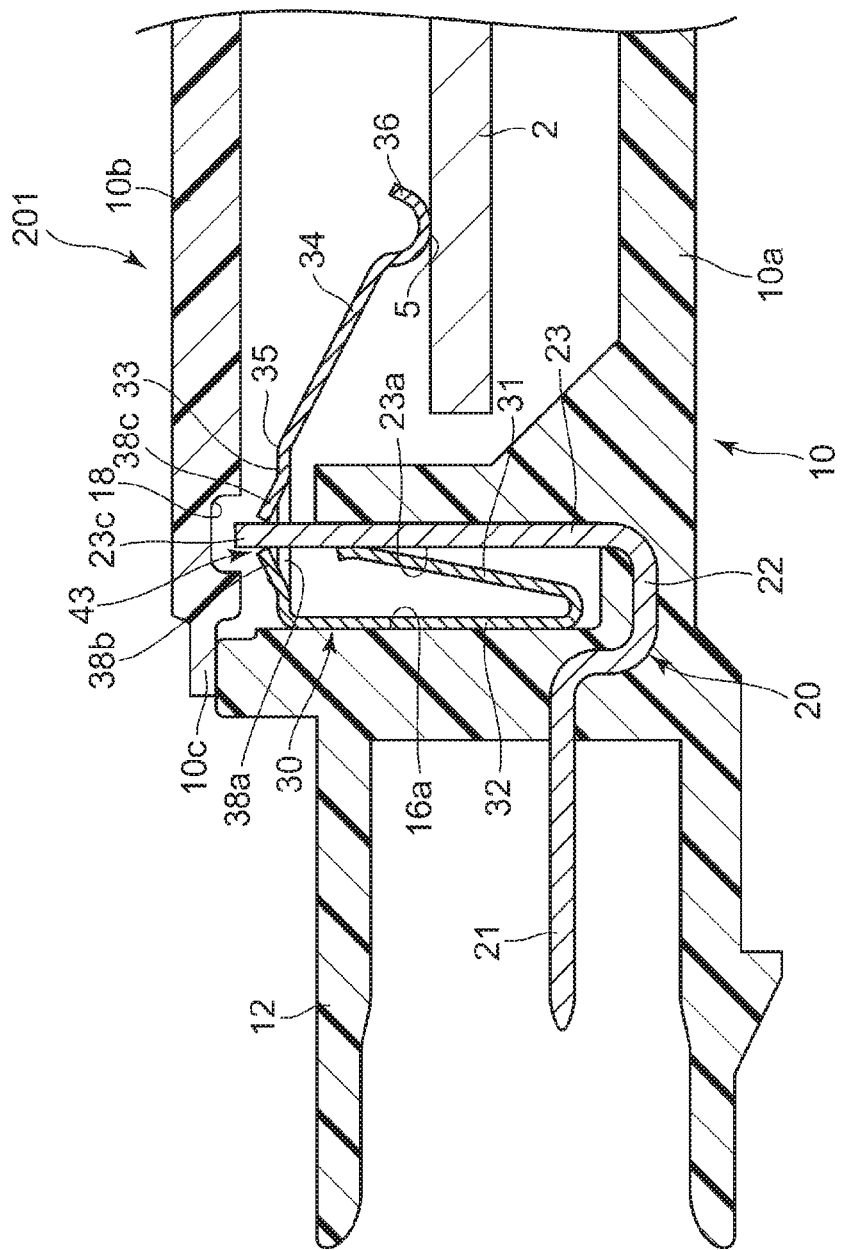
FIG. 6 is a partially enlarged view of a cross-sectional view of an electronic device in a third embodiment.

FIG. 5 illustrates an electronic device in a second embodiment of the present invention, and FIG. 6 illustrates an electronic device in a third embodiment of the present invention. In FIGS. 5 and 6, structural portions that are the same as in the first embodiment will be given the same reference characters and detailed descriptions will be omitted.

In the electronic device 101, illustrated in FIG. 5, in the second embodiment of the present invention, a hole 33a and a stop piece 38b, which is cut upward from the hole 33a, may be formed integrally with the support piece portion 33 of the elastic conductive plate 30. The linkage end 23c, which is the top of the contact plate portion 23 of the fixed conductive plate 20, may be inserted into the hole 38a and the edge at the top of the stop piece 38b may be elastically pressed against the linkage end 23c and be stopped, forming a restricting portion 42 that prevents the support piece portion 33 from being deformed in a direction away from the fixed electrode portion 5 and also prevents the support piece portion 33 from moving.

In the electronic device 201, illustrated in FIG. 6, in the third embodiment of the present invention, a pair of stop pieces 38b and 38c, which extend in mutually opposite directions, is formed in the hole 33a in the support piece portion 33. When the edges at the tops of the stop pieces 38b and 38c are elastically pressed against and are fitted to the front surfaces on both sides of the linkage end 23c inserted into the hole 33a, a restricting portion 43 is formed.

Also, as illustrated in FIGS. 5 and 6, the concave portion 18 is formed in the lower surface of the second case 10b, and the upper end of the linkage end 23c is inserted into the concave portion 18. Therefore, even if unexpected acceleration is exerted, the support piece portion 33 does not come off the linkage end 23c.

What is claimed is:

1. An electronic device comprising:
   a fixed conductive plate, one part of which is an external terminal portion and another part of which is a linkage end;
   an elastic conductive plate connected to the fixed conductive plate;
   a fixed electrode portion that is electrically continuous to the elastic conductive plate; and
   a case in which the fixed conductive plate, the elastic conductive plate, and the fixed electrode portion are disposed; wherein:
   a first contact surface and a second contact surface, which are opposite to each other, are provided in the case, at least one of the first contact surface and the second contact surface being a front plate surface of the fixed conductive plate,
   the elastic conductive plate is an integrally formed plate comprising a leaf spring metal material, a first pressure contact portion, which is elastically pressed against the first contact surface, a second pressure contact portion, which is turned-backed from the first pressure contact portion and is elastically pressed against the second contact surface, a support piece portion, which is bent from the second pressure contact portion and extends beyond the first contact surface, an elastic arm portion, which is bent from the support piece portion and extends toward the fixed electrode portion, and an elastically-pressed contact point, which is provided at a top of the elastic arm portion so as to be elastically pressed against the fixed electrode portion,
   at least one of the first pressure contact portion and the second pressure contact portion is in contact with the front plate surface of the fixed conductive plate, and
   the linkage end and the support piece portion of the elastic conductive plate are fitted to each other to form a restricting portion that restricts the support piece from separating from the fixed electrode portion.

2. The electronic device according to claim 1, wherein:
   a hole is in the support piece portion; and
   in the restricting portion, the linkage end is fitted into the hole in the restricting portion.

3. The electronic device according to claim 2, wherein:
   a thickness of the linkage end is small; and
   the linkage end having the small thickness is fitted into the hole.

4. The electronic device according to claim 2, wherein:
   at least one stop piece comprises a stop piece that is cut and raised in the support piece portion; and,
   in the restricting portion, the top of the stop piece is stopped at the linkage end inserted into the hole.

5. The electronic device according to claim 1, wherein:
   a concave portion opposite to the linkage end is in the case; and
   the top of the linkage end is inserted into the concave portion.

* * * * *